US010278298B2

(12) United States Patent
De Vis et al.

(10) Patent No.: US 10,278,298 B2
(45) Date of Patent: Apr. 30, 2019

(54) DOOR HINGE MECHANISM FOR TELECOMMUNICATIONS PANEL

(71) Applicant: CommScope Connectivity Belgium BVBA, Kessel-Lo (BE)

(72) Inventors: Willem De Vis, Merchtem (BE); Heidi Bleus, Genk (BE)

(73) Assignee: CommScope Connectivity Belgium BVBA, Kessel-Lo (BE)

( * ) Notice: Subject to any disclaimer, the term of this patent is extended or adjusted under 35 U.S.C. 154(b) by 0 days.

(21) Appl. No.: 15/328,227

(22) PCT Filed: Jul. 13, 2015

(86) PCT No.: PCT/EP2015/065985
§ 371 (c)(1),
(2) Date: Jan. 23, 2017

(87) PCT Pub. No.: WO2016/012295
PCT Pub. Date: Jan. 28, 2016

(65) Prior Publication Data
US 2017/0208698 A1  Jul. 20, 2017

Related U.S. Application Data

(60) Provisional application No. 62/027,657, filed on Jul. 22, 2014.

(51) Int. Cl.
*H05K 5/00* (2006.01)
*H05K 5/02* (2006.01)
(Continued)

(52) U.S. Cl.
CPC ........... *H05K 5/0226* (2013.01); *H04Q 1/026* (2013.01); *H05K 7/186* (2013.01)

(58) Field of Classification Search
None
See application file for complete search history.

(56) References Cited

U.S. PATENT DOCUMENTS

| 4,840,449 A | 6/1989 | Ghandeharizadeh |
| 5,823,646 A | 10/1998 | Arizpe et al. |
| (Continued) | | |

FOREIGN PATENT DOCUMENTS

| CN | 202421594 U | 9/2012 |
| GB | 2 504 281 A | 1/2014 |
| (Continued) | | |

OTHER PUBLICATIONS

International Search Report and Written Opinion of the International Searching Authority for corresponding PCT Application No. PCT/EP2015/065985 dated Oct. 22, 2015, 9 pages.

*Primary Examiner* — Courtney L Smith
*Assistant Examiner* — Rashen E Morrison
(74) *Attorney, Agent, or Firm* — Merchant & Gould P.C.

(57) ABSTRACT

A hinge mechanism (10) for pivotally coupling a door (12) to a telecommunications chassis (14) includes an outer hinge arm (46) configured to be pivotally attached with respect to the chassis (14) and an inner hinge arm (48) configured to be pivotally attached with respect to both the outer hinge arm (46) and the door (12) of the chassis (14). The hinge mechanism (10) is configured such that when the door (12) is fully closed, the outer and inner hinge arms (46, 48) are generally vertically overlapped, and when the door (12) is fully open, the outer and inner hinge arms (46, 48) are generally at a perpendicular angle with respect to each other.

13 Claims, 10 Drawing Sheets

(51) Int. Cl.
*H04Q 1/02* (2006.01)
*H05K 7/18* (2006.01)

(56) References Cited

U.S. PATENT DOCUMENTS

| | | | |
|---|---|---|---|
| 5,913,352 | A | 6/1999 | Scates et al. |
| 5,966,492 | A | 10/1999 | Bechamps et al. |
| D466,087 | S | 11/2002 | Cuny et al. |
| 7,070,459 | B2 | 7/2006 | Denovich et al. |
| 7,462,779 | B2 | 12/2008 | Caveney et al. |
| 7,570,860 | B2 | 8/2009 | Smrha et al. |
| 7,570,861 | B2 | 8/2009 | Smrha et al. |
| 7,873,252 | B2 | 1/2011 | Smrha et al. |
| 7,873,253 | B2 | 1/2011 | Smrha et al. |
| 8,229,265 | B2 | 7/2012 | Solheid et al. |
| 8,340,490 | B2 | 12/2012 | Smrha et al. |
| 8,346,044 | B2 | 1/2013 | Smrha et al. |
| 8,363,998 | B2 | 1/2013 | Newman et al. |
| 8,867,884 | B2 | 10/2014 | Smrha et al. |
| 8,886,335 | B2 | 11/2014 | Pianca et al. |
| 8,923,013 | B2 | 12/2014 | Anderson et al. |
| 8,934,252 | B2 | 1/2015 | Anderson et al. |
| 8,934,253 | B2 | 1/2015 | Anderson et al. |
| 8,953,921 | B2 | 2/2015 | Smrha et al. |
| 9,020,319 | B2 | 4/2015 | Anderson et al. |
| 9,066,453 | B2 * | 6/2015 | Wagner ............... H05K 1/0203 |
| 9,097,871 | B2 | 8/2015 | Smrha et al. |
| 9,488,788 | B2 | 11/2016 | Murray et al. |
| 9,535,226 | B2 | 1/2017 | Simmons |
| 9,816,304 | B2 | 11/2017 | Wells et al. |
| 2004/0007348 | A1 * | 1/2004 | Stoller ................. H02B 1/565 |
| | | | 165/47 |
| 2005/0199354 | A1 | 9/2005 | Marandon et al. |
| 2006/0168759 | A1 * | 8/2006 | Laursen ................. H04Q 1/09 |
| | | | 16/358 |
| 2007/0189692 | A1 | 8/2007 | Zimmel et al. |
| 2008/0079341 | A1 | 4/2008 | Anderson et al. |
| 2008/0180004 | A1 * | 7/2008 | Martich ................. H04Q 1/10 |
| | | | 312/223.1 |
| 2010/0054683 | A1 | 3/2010 | Cooke et al. |
| 2010/0296790 | A1 | 11/2010 | Cooke et al. |
| 2010/0322582 | A1 | 12/2010 | Cooke et al. |
| 2011/0023272 | A1 * | 2/2011 | Huang ..................... E05D 3/18 |
| | | | 16/362 |
| 2011/0232035 | A1 | 9/2011 | Huang et al. |
| 2011/0268412 | A1 | 11/2011 | Giraud et al. |
| 2012/0267991 | A1 | 10/2012 | Adducci et al. |
| 2014/0086545 | A1 | 3/2014 | Solheid et al. |
| 2014/0208542 | A1 | 7/2014 | White |
| 2014/0219614 | A1 | 8/2014 | Marcouiller et al. |
| 2014/0219615 | A1 | 8/2014 | Petersen et al. |
| 2015/0177780 | A1 | 6/2015 | Anderson et al. |
| 2015/0195945 | A1 | 7/2015 | Anderson et al. |
| 2015/0219869 | A1 | 8/2015 | Anderson et al. |
| 2015/0245530 | A1 | 8/2015 | Anderson et al. |
| 2015/0286021 | A1 | 10/2015 | Smrha et al. |
| 2015/0331214 | A1 | 11/2015 | Smrha et al. |
| 2015/0331215 | A1 | 11/2015 | Smrha et al. |
| 2015/0331216 | A1 | 11/2015 | Smrha et al. |
| 2015/0370025 | A1 | 12/2015 | Wells et al. |
| 2016/0077297 | A1 | 3/2016 | Wells et al. |
| 2016/0231525 | A1 | 8/2016 | Murray et al. |

FOREIGN PATENT DOCUMENTS

| | | |
|---|---|---|
| JP | 2009-097157 A | 5/2009 |
| WO | 2010/135523 A1 | 11/2010 |
| WO | 2011/094327 A1 | 8/2011 |
| WO | 2011/100613 A1 | 8/2011 |
| WO | 2013/052854 A2 | 4/2013 |
| WO | 2013/106820 A1 | 7/2013 |
| WO | 2015/040211 A1 | 3/2015 |
| WO | 2016/012295 A1 | 1/2016 |
| WO | 2017/184501 A1 | 10/2017 |

* cited by examiner

DOOR HINGE MECHANISM FOR TELECOMMUNICATIONS PANEL

CROSS-REFERENCE TO RELATED APPLICATION

The present application is a National Stage of PCT/EP2015/065985, filed Jul. 13, 2015, which claims the benefit of U.S. Provisional Patent Application Ser. No. 62/027,657, filed Jul. 22, 2014, and which applications are hereby incorporated by reference in their entireties. To the extent appropriate, a claim of priority is made to each of the above disclosed applications.

BACKGROUND

As demand for telecommunications increases, fiber optic networks are being extended in more and more areas. Management of the cables, ease of installation, and ease of accessibility for later management are important concerns. As a result, there is a need for fiber optic devices which address these and other concerns.

SUMMARY

According to an inventive aspect, the present disclosure relates to a hinge mechanism for the door of a telecommunications chassis or panel, wherein the hinge mechanism is configured to allow the door of the chassis to be fully opened, allowing extension or removal of "pull-out" blades or trays installed in the chassis. According to an aspect of the disclosure, the hinge mechanism may be used for a fiber optic chassis, wherein the "pull-out" trays may house fiber optic equipment in the form of fiber optic cassettes. Each cassette may include at least one connector that provides a signal entry location and at least one connector that provides a signal exit location and a fiber optical circuit thereinbetween for relaying the signal from the entry location to the exit location. The door hinge mechanism allows the trays to be fully pulled out of the chassis for access to the connectors of the cassettes.

According to another aspect, the present disclosure relates to a telecommunications system comprising a telecommunications chassis, a door pivotally attached to the chassis via a hinge mechanism, the hinge mechanism further comprising an outer hinge arm pivotally attached with respect to the chassis and an inner hinge arm pivotally attached with respect to both the outer arm and the door, wherein when the door is fully closed, the outer and inner hinge arms are generally vertically overlapped and when the door is fully open, the outer and inner hinge arms are generally at a perpendicular angle with respect to each other.

According to another aspect, the present disclosure relates to a hinge mechanism for pivotally coupling a door to a telecommunications chassis. The hinge mechanism comprises an outer hinge arm configured to be pivotally attached with respect to the chassis and an inner hinge arm configured to be pivotally attached with respect to both the outer arm and the door of the chassis, wherein the hinge mechanism is configured such that when the door is fully closed, the outer and inner hinge arms are generally vertically overlapped and when the door is fully open, the outer and inner hinge arms are generally at a perpendicular angle with respect to each other.

According to another aspect, the present disclosure relates to a telecommunications system comprising a telecommunications chassis and a door attached to the chassis via a hinge mechanism, wherein the hinge mechanism is configured such that door can move both pivotally and linearly with respect to the chassis.

According to another aspect, the present disclosure relates to a telecommunications system comprising a telecommunications chassis and a door pivotally attached to the chassis via a hinge mechanism and movable via the hinge mechanism from a fully closed position to a fully open position, wherein the hinge mechanism is configured such that the door is entirely positionable below a horizontal plane defined by a bottom side of the chassis when the door is at a fully open position.

According to another aspect, the present disclosure relates to a method of opening and/or closing a door of a telecommunications chassis comprising linearly moving the entire door along a direction to and away from the chassis as well as pivoting the entire door with respect to the chassis about at least one pivot axis.

According to another aspect, the present disclosure relates to a method of opening and/or closing a door of a telecommunications chassis comprising pivoting the entire door with respect to the chassis about at least three parallel pivot axes.

A variety of additional inventive aspects will be set forth in the description that follows. The inventive aspects can relate to individual features and combinations of features. It is to be understood that both the foregoing general description and the following detailed description are exemplary and explanatory only and are not restrictive of the broad inventive concepts upon which the embodiments disclosed herein are based.

DETAILED DESCRIPTION

Figure 1:
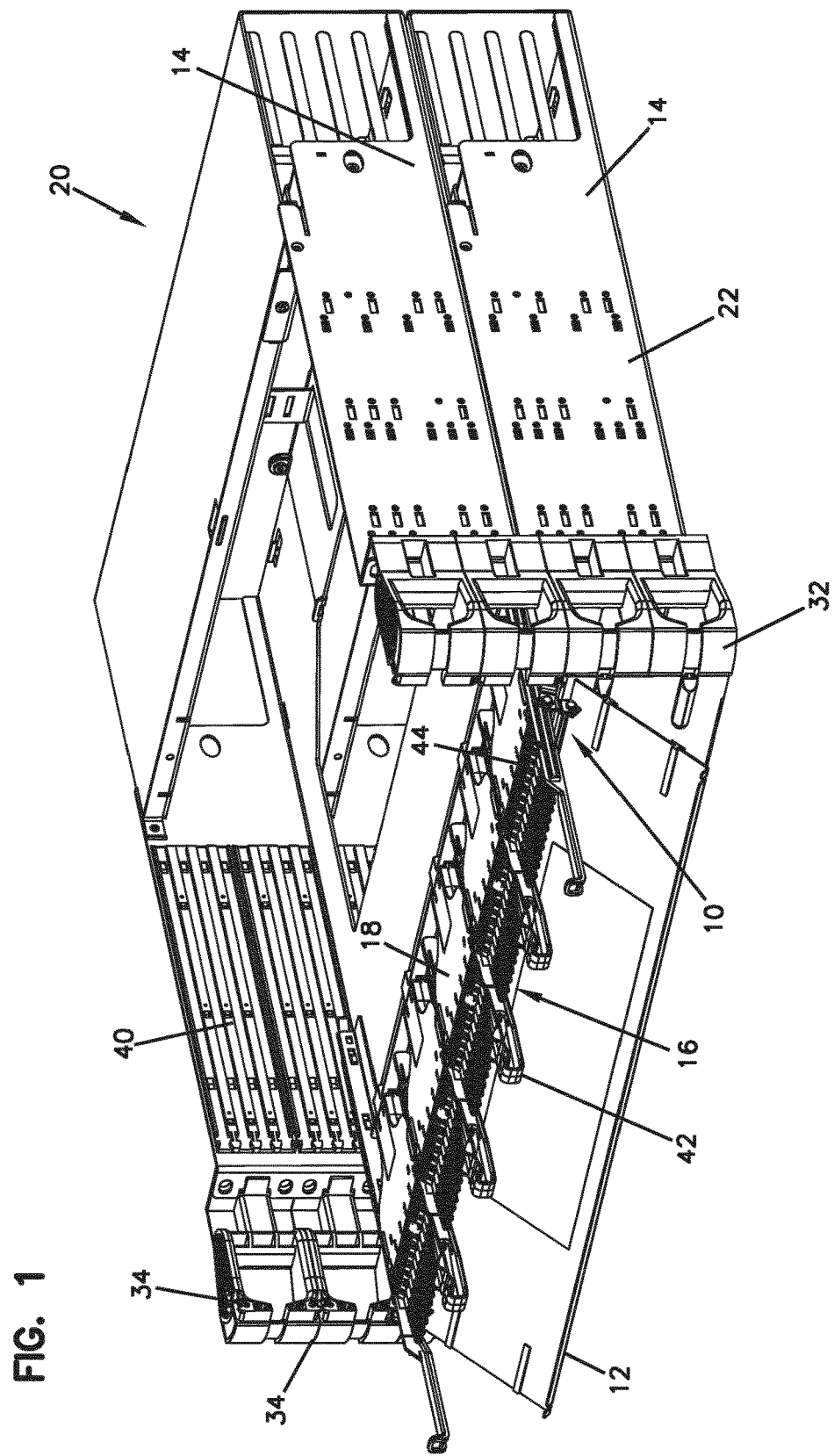
FIG. 1 is a top, front, right side perspective view of a fiber optic telecommunications chassis stack comprising two vertically stacked chassis, each chassis including a door hinge mechanism having features that are examples of inventive aspects in accordance with the present disclosure, the door of the upper chassis of the stack shown in a fully open position with a telecommunications tray shown fully extended.

The present disclosure is directed to an inventive hinge mechanism 10 that can be used for a door 12 (or a different cover structure) of a telecommunications chassis or panel 14. The hinge mechanism 10 is configured to allow the door 12 of the chassis 14 to be fully opened. With the hinge mechanism 10, the door 12 of a chassis 14 can overlay the door 12 of an adjacent chassis 14 directly underneath thereof without interfering with the hinge mechanism 10 associated with the lower door 12. This allows extension or removal of "pull-out" blades or trays 16 installed in the upper chassis 14.

According to an aspect of the disclosure, the hinge mechanism 10 may be used for a telecommunications chassis 14 in the form of a fiber optic chassis, wherein the "pull-out" trays 16 may house fiber optic equipment. According to one example embodiment, the fiber optic equipment housed by the trays 16 may be in the form of fiber optic cassettes 18.

An example of a fiber optic chassis or panel 14 that includes "pull-out" blades or trays 16 that may utilize the door hinge mechanism 10 of the present disclosure is shown in FIGS. 1-7. The chassis 14 shown in the present application is similar to a chassis shown and described in further detail in U.S. Provisional Application Ser. No. 61/982,406, filed on Apr. 22, 2014, (now PCT Publication No. WO 2015/040211), the entire disclosure of which is incorporated herein by reference. For further details regarding the configuration of the chassis 14 and the blades 16 housed therein, including the operation thereof, reference may be made to the '406 Application incorporated herein.

It should be noted that although the door hinge mechanism 10 of the present disclosure may be used on and will be described with respect to a chassis or panel 14 similar in configuration to the chassis shown in the '406 Application, the door hinge mechanism 10 may be utilized on any telecommunications chassis that may require access to equipment therein. The chassis 14 shown herein and also shown in the '406 Application are simply examples of the types of chassis that may utilize the hinge mechanism 10 of the present disclosure. These chassis 14 are particularly suitable for the hinge mechanism 10 of the present disclosure since they include "pull-out" trays or blades 16 that may need full opening of the doors 12 for accessing or removing the trays 16. The inventive hinge mechanism 10 of the present disclosure allows the door 12 to be fully opened to allow the trays 16 to slide out of the chassis 14. The hinge mechanism 10 is configured such that it positions an upper door 12 in front of the door 12 of an adjacent lower chassis 14 when the upper door 12 is fully opened. Also, the hinge mechanism 10 is configured such that the hinge mechanism 10 stays visually hidden from an exterior of the chassis 14 when the door 12 is closed. In this manner, when the chassis 14 is in a stacked configuration with another chassis 14, the doors 12 of the chassis 14 lay flush with respect to each other, without the hinge mechanism 10 being visible from an exterior of the chassis stack 20.

Referring now to FIGS. 1-7, a chassis stack 20 including two chassis or panels 14, wherein each one includes the hinge mechanism 10 of the present disclosure, is shown in various configurations.

Figure 2:
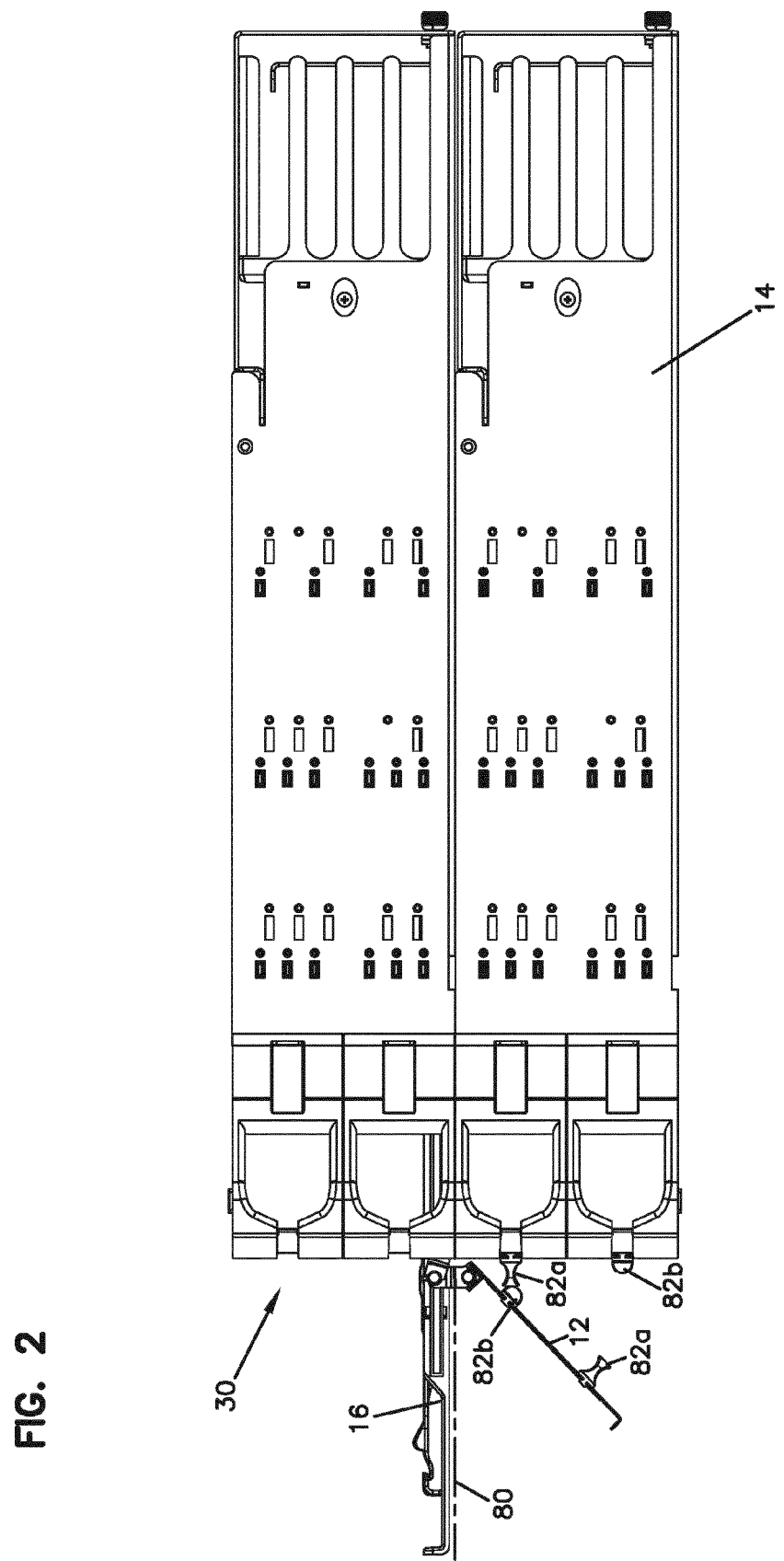
FIG. 2 is a side view of the chassis stack of FIG. 1.
Figure 3:
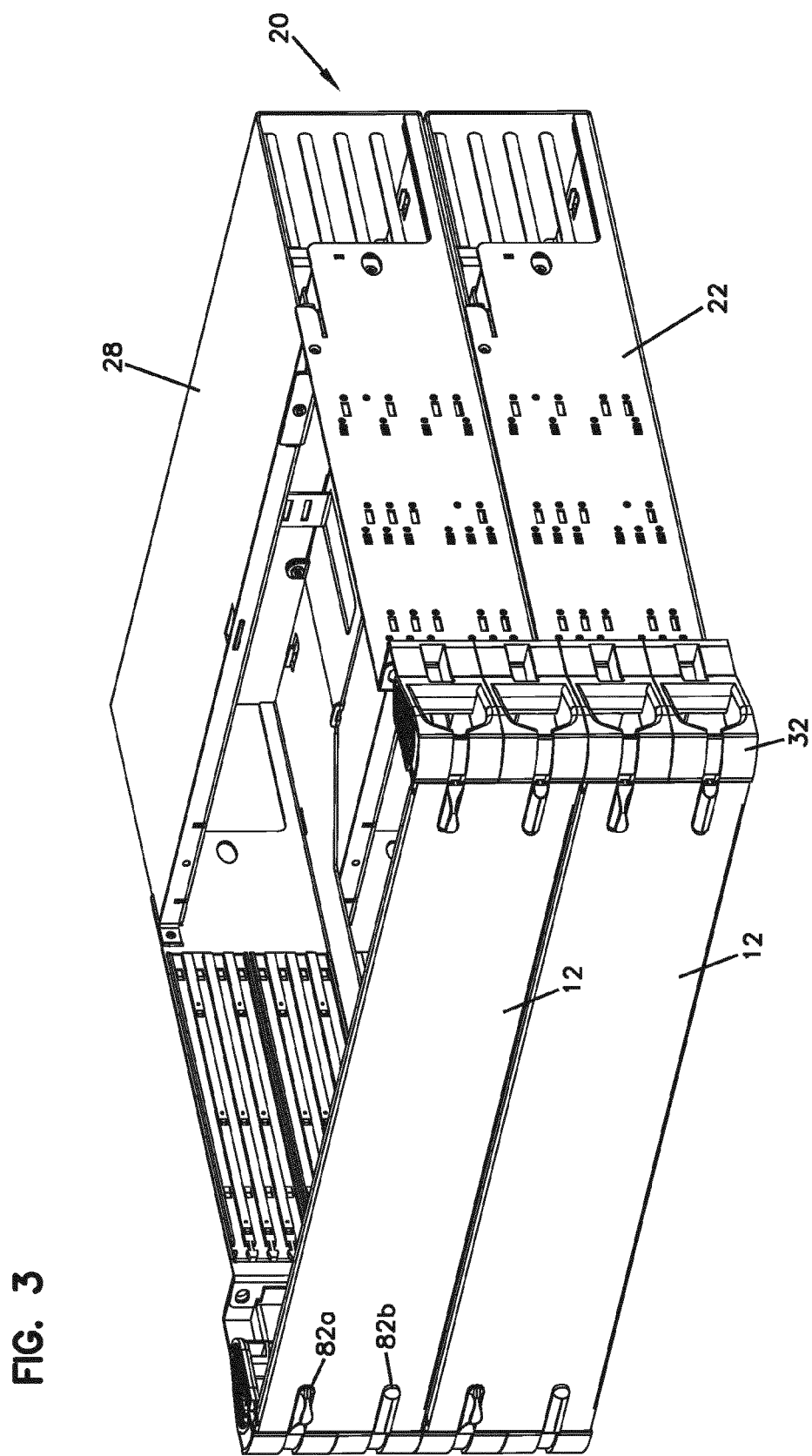
FIG. 3 illustrates the chassis stack of FIG. 1 with the tray removed from the upper chassis and with the doors of the chassis fully closed.
Figure 4:
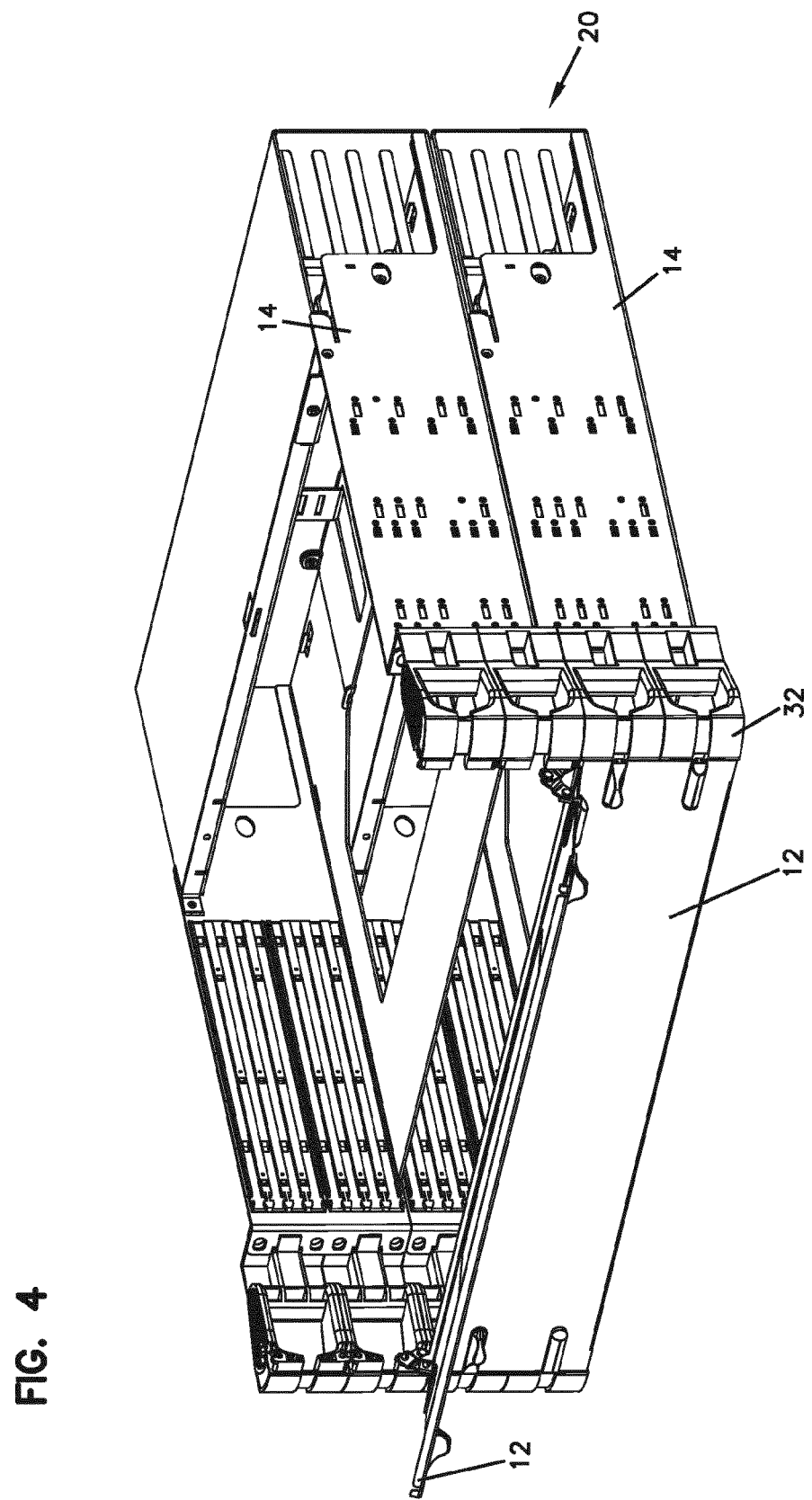
FIG. 4 illustrates the chassis stack of FIG. 3 with the door of the upper chassis partially open.
Figure 5:
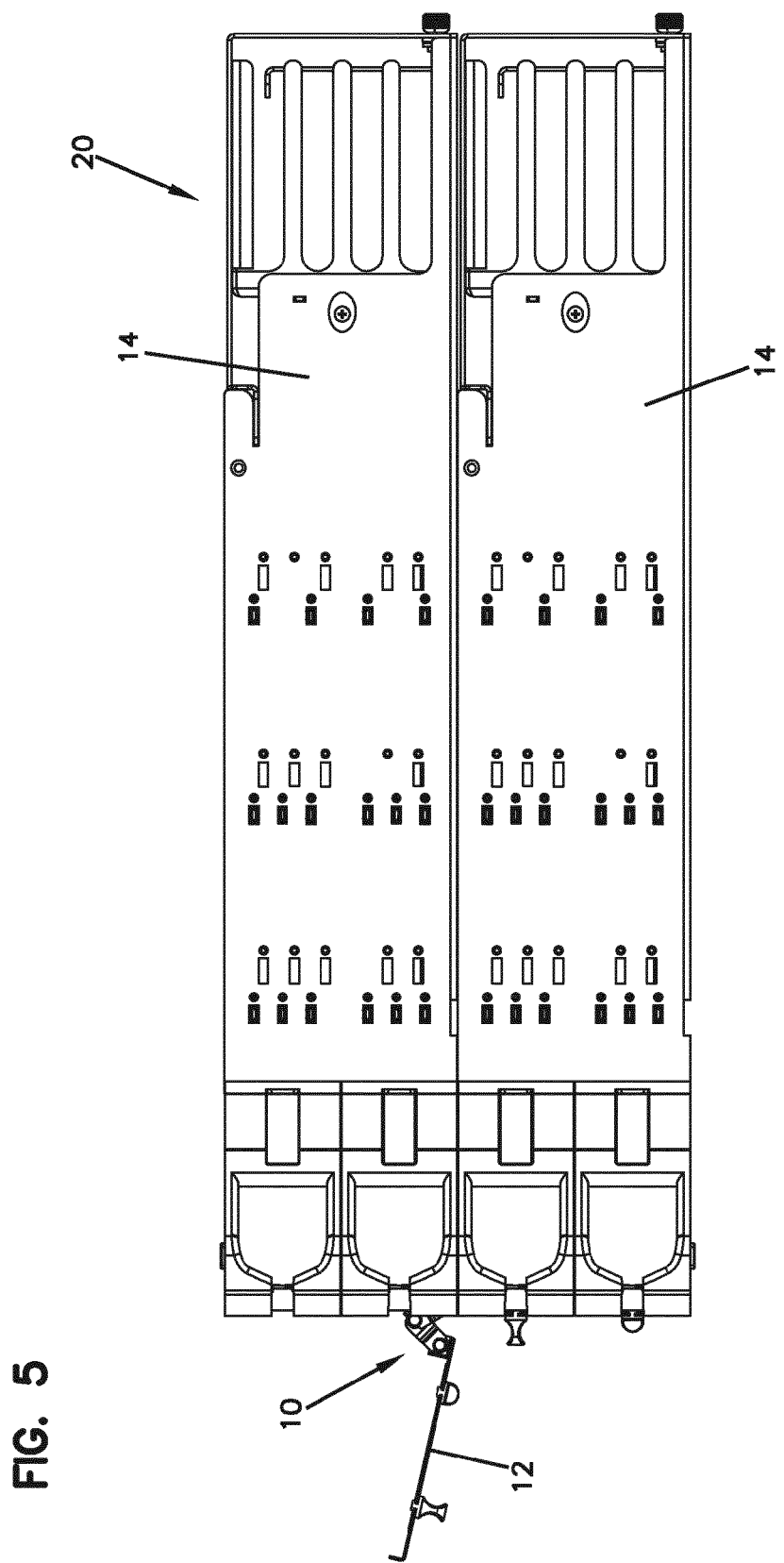
FIG. 5 is a side view of the chassis stack of FIG. 4.
Figure 6:
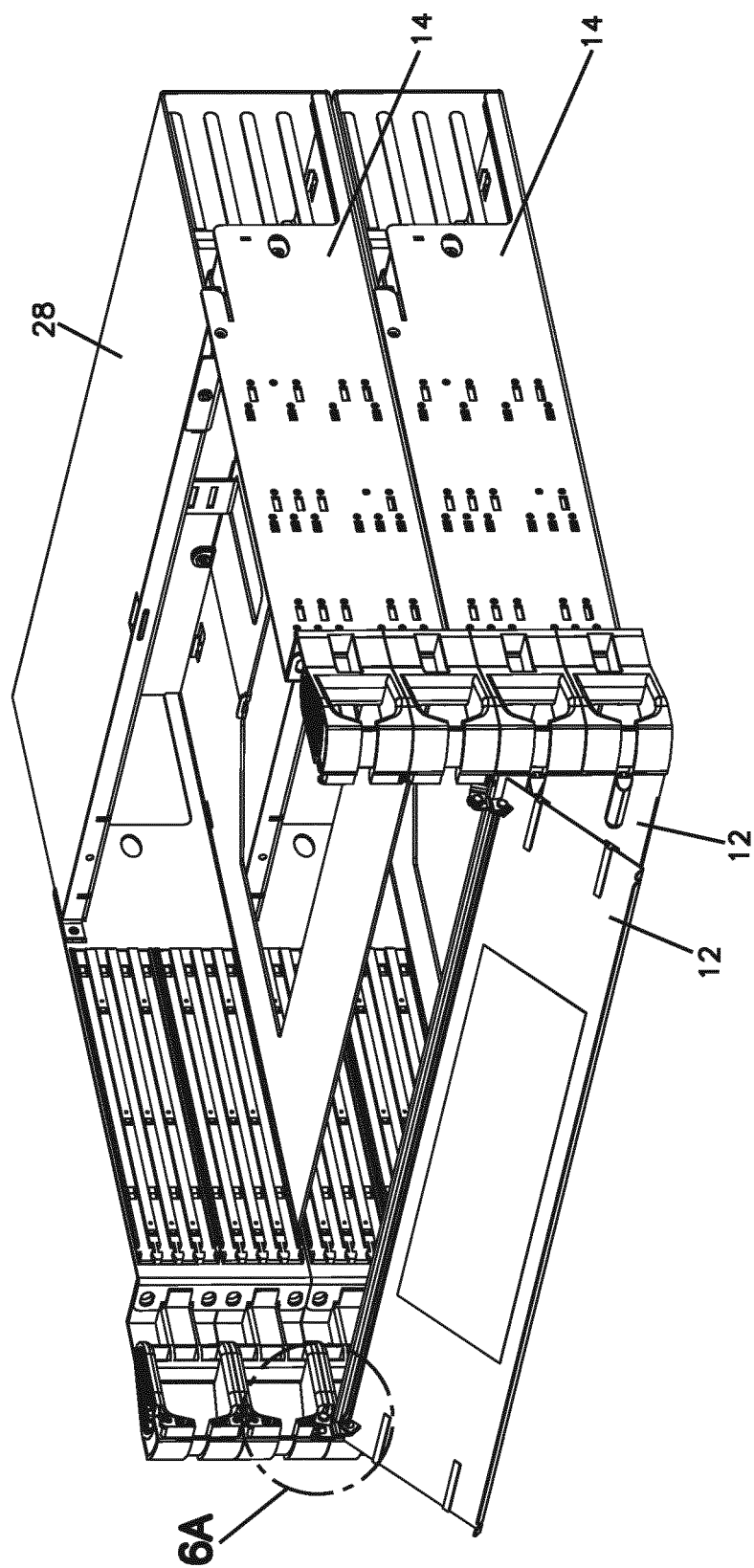
FIG. 6 illustrates the chassis stack of FIG. 3 with the door of the upper chassis fully open.
Figure 7B:
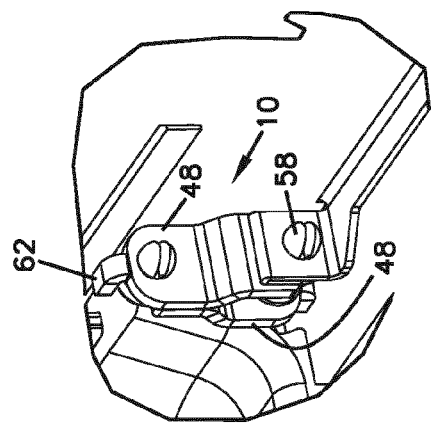
FIG. 7B is a close up view of a portion of the hinge mechanism of the lower chassis shown in FIG. 7.
Figure 7A:
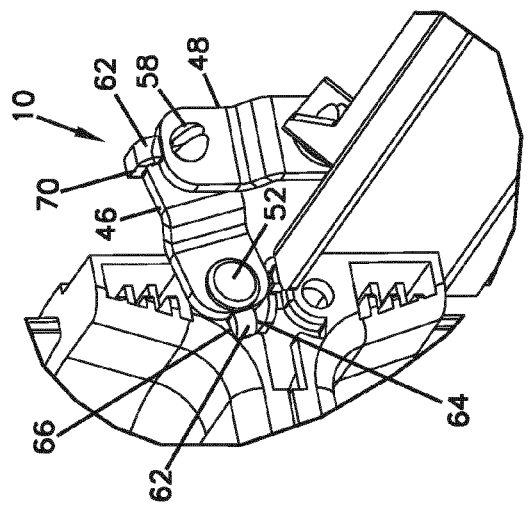
FIG. 7A is a close up view of a portion of the hinge mechanism of the upper chassis shown in FIG. 7.
Figure 6A:
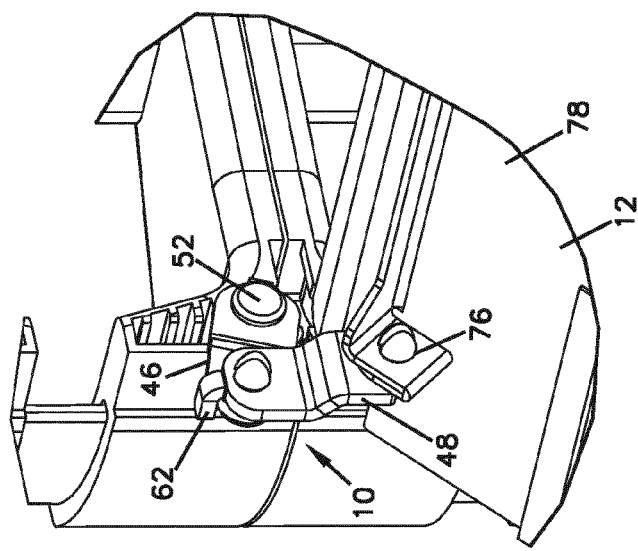
FIG. 6A is a close up view of a portion of the hinge mechanism of the upper chassis shown in FIG. 6.
Figure 7:
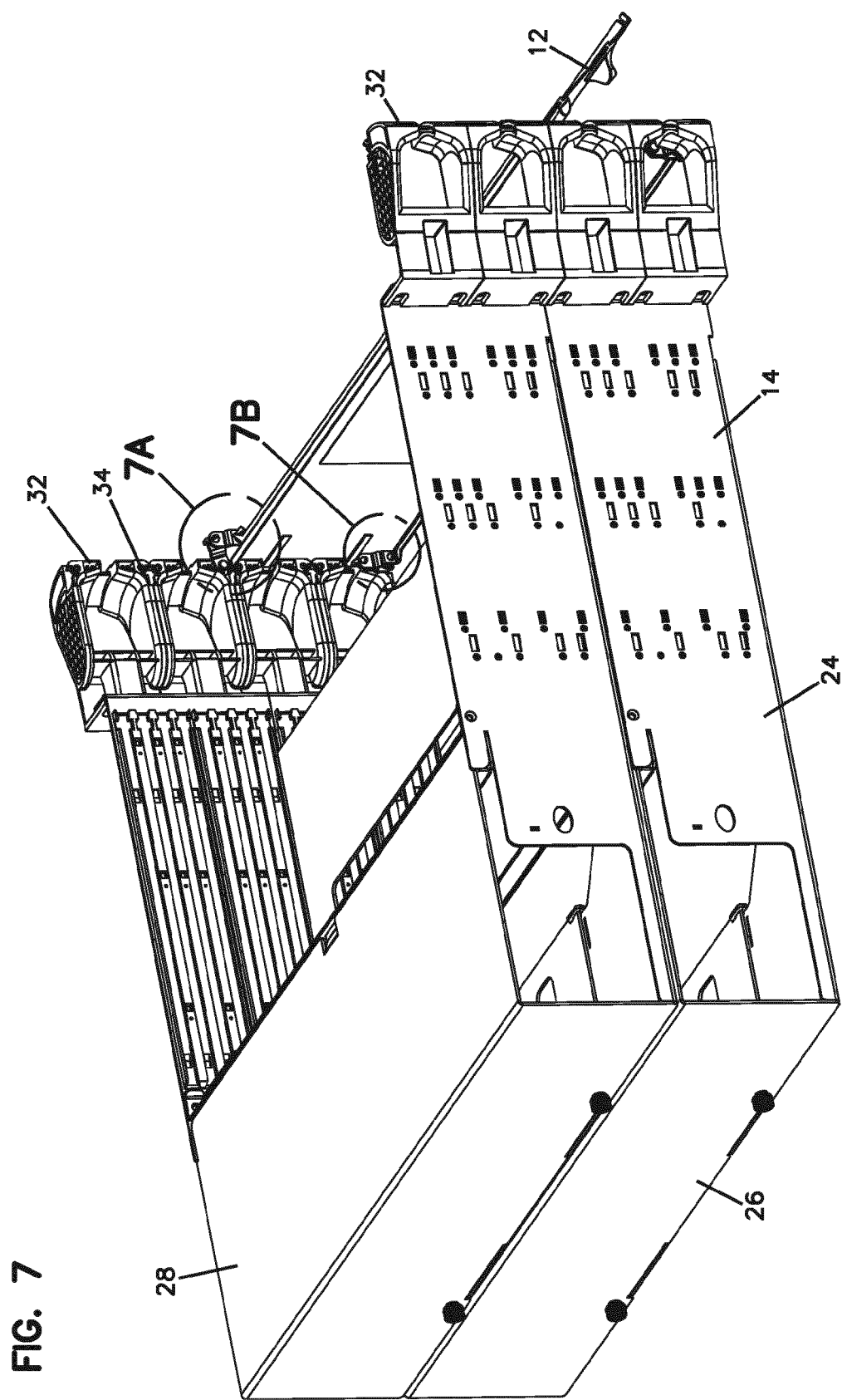
FIG. 7 is a top, rear, left side perspective view of the chassis stack of FIG. 6, wherein the door of the upper chassis is fully open and the door of the lower chassis is fully closed.
Figure 8:
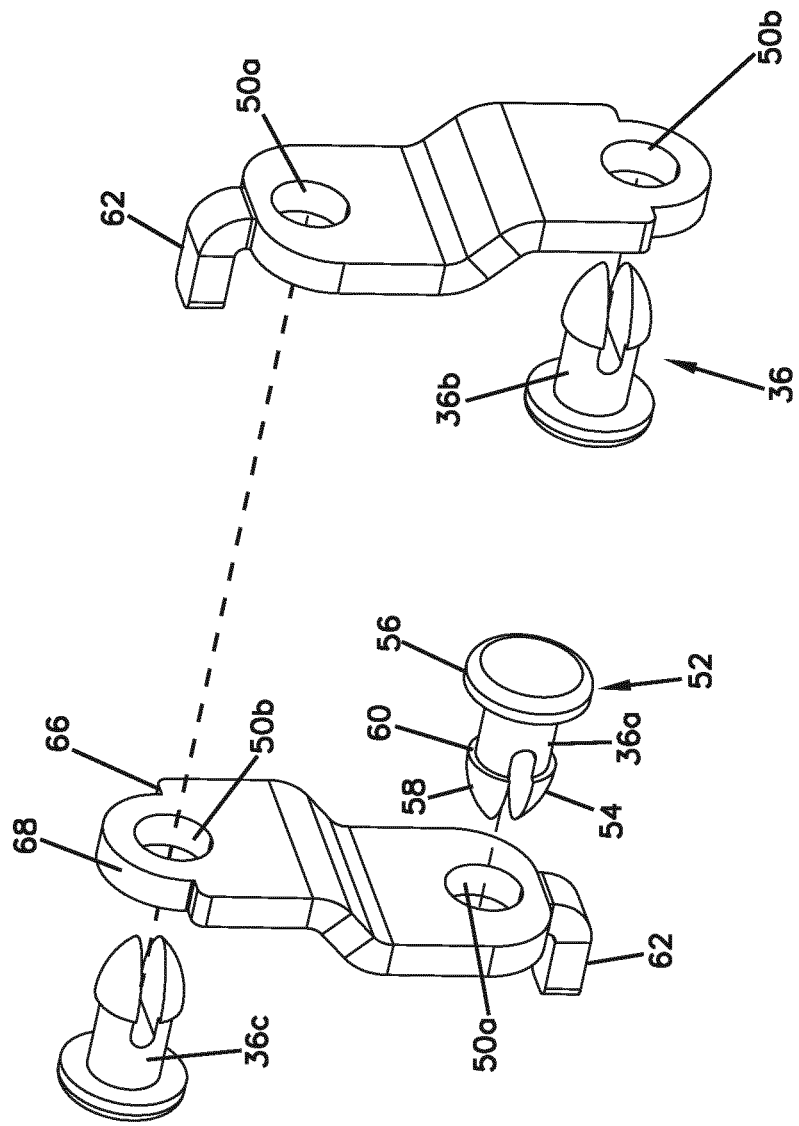
FIG. 8 illustrates one side of the inventive hinge mechanism in isolation removed from the chassis of FIG. 6A, the hinge mechanism shown in a fully exploded configuration.
Figure 9:
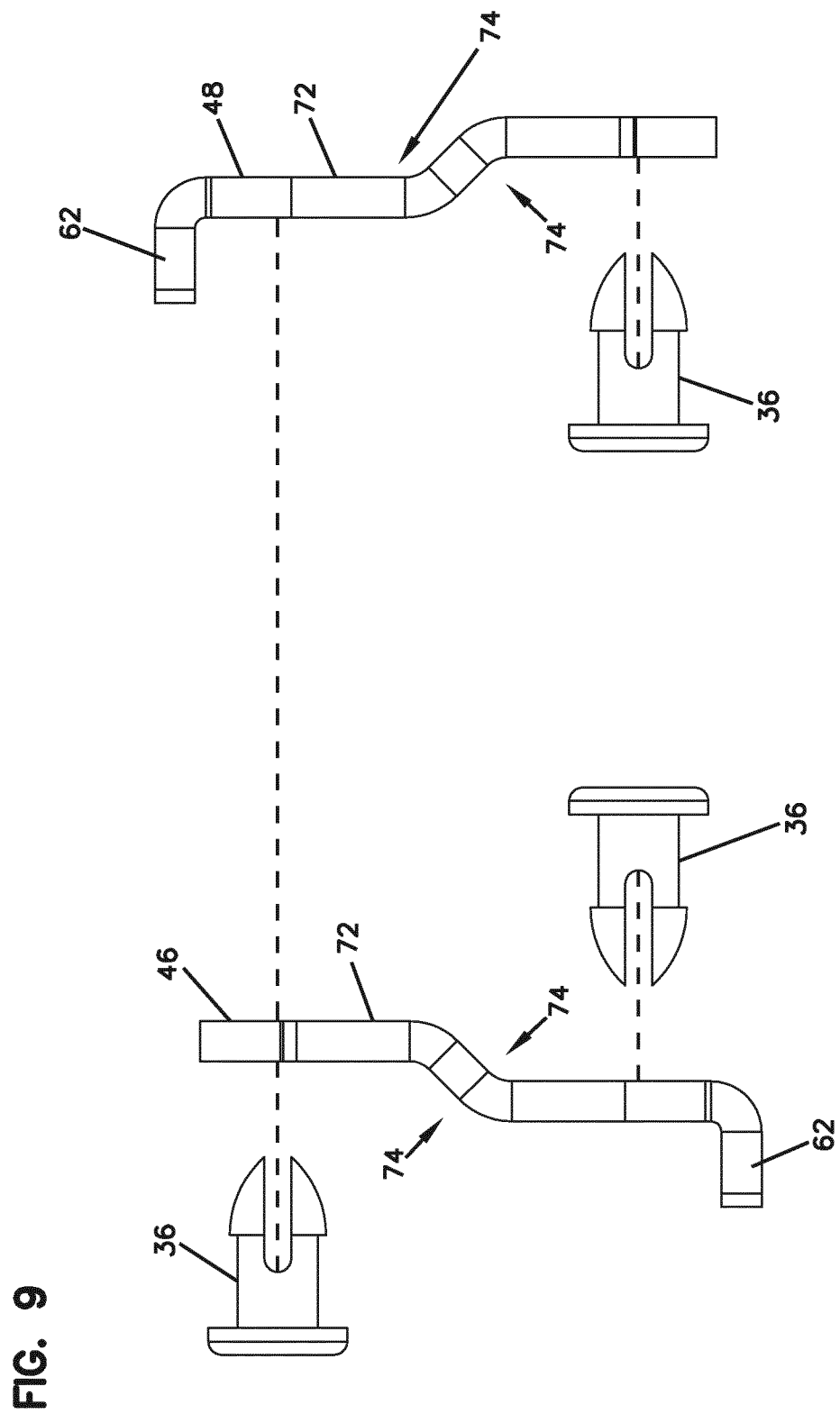
FIG. 9 illustrates a front view of the hinge mechanism of FIG. 8.

In FIGS. 1 and 2, the chassis stack 20 is shown with the door 12 of the upper chassis 14 in a fully open position with a telecommunications tray 16 fully extended. FIG. 3 depicts the chassis stack 20 of FIG. 1 with the tray 16 removed from the upper chassis 14 and with the doors 12 of the chassis 14 fully closed to illustrate the hidden aspect of the hinge mechanism 10. FIGS. 4 and 5 illustrate the chassis stack 20 of FIG. 3 with the door 12 of the upper chassis 14 partially open. FIG. 6 illustrates the chassis stack 20 with the door 12 of the upper chassis 14 fully open, and FIG. 6A is a close up view of a portion of the hinge mechanism 10 of the upper chassis 14 shown in FIG. 6. FIG. 7 is a top, rear, left side perspective view of the chassis stack 20 of FIG. 6, wherein the door 12 of the upper chassis 14 is fully open, and the door 12 of the lower chassis 14 is fully closed. FIG. 7A is a close up view of a portion of the hinge mechanism 10 of the upper chassis 14 shown in FIG. 7, and FIG. 7B is a close up view of a portion of the hinge mechanism 10 of the lower chassis 14 shown in FIG. 7. FIGS. 8 and 9 illustrate the hinge mechanism 10 of the present disclosure in isolation removed from the chassis stack 20, the hinge mechanism 10 shown in a fully exploded configuration.

Referring back to FIGS. 1-7, the telecommunications chassis 14 that are shown in FIGS. 1-7 are configured for mounting to a telecommunications rack that may be a standard 19-inch rack.

According to the depicted embodiment, each chassis 14 is defined by a right wall 22, a left wall 24, a rear wall 26, and a top wall 28 that extends from the right wall 22 to the left wall 24. The chassis 14 defines an open front 30 that is closable by the door 12. The door 12 is mounted to the chassis 14 using the inventive hinge mechanism 10 of the present disclosure.

The chassis 14 is configured to house slidable blades 16 that are configured to hold fiber optic cassettes 18. Each depicted chassis 14 is configured to house eight slidable blades 16 in a vertically stacked arrangement, with each blade 16 housing five fiber optic cassettes 18 as shown. Each chassis 14 is configured to occupy a height of two standard rack units (2RU). Within the 2RU height, the chassis 14 can house the eight blades or trays 16 that are mounted in a stacked arrangement.

Each chassis 14 also includes cable rings 32 adjacent the front 30 of the chassis 14 for managing cables leading to or away from the optical devices housed within the chassis 14. In the present disclosure, the hinge mechanisms 10 are depicted as being mounted to the cable rings 32. The cable rings 32 have been configured with mounting openings 34 for receiving hinge pins 36 of the hinge mechanisms 10, as will be described in further detail below. It should be noted that even though the inventive hinge mechanisms 10 of the present disclosure have been shown to be mounted to the chassis 14 of the present disclosure via the cable rings 32, in other embodiments, the hinge mechanisms 10 may be mounted to different parts of the chassis 14 as long as the chassis 14 have been configured to receive the hinge pins 36 of the mechanisms 10.

At the interior side 38 of each of the right and left walls 22, 24, each chassis 14 defines mounting slots 40 for receiving slide mechanisms of the trays 16. The mounting slots 40 are positioned to accommodate eight such trays 16 in a stacked arrangement within the 2RU space. The mounting slots 40 may be configured to provide positive stops for "retracted," "neutral," and "extended" positions for the trays 16. The hinge mechanism 10 of the present disclosure allows the trays 16 to be slidably moved to the "extended" position as shown in FIGS. 1 and 2 and also allows full removal of the trays 16 from the chassis 14.

As discussed above, the blades or trays 16 of the chassis 14 are shown to include devices in the form of fiber optic cassettes 18 with cable management devices 42 located between each of the cassettes 18. In the depicted embodiment, each blade 16 is configured to hold five fiber optic cassettes 18 along a row within the 19-inch standard rack spacing. The depicted cassette 18 is configured to provide twelve connection locations defined by standard LC format adapters 44 at the front of the cassette 18. With five cassettes 18 located on each blade 16 and with eight blades 16 located on each chassis 14, the chassis 14 can accommodate 480 standard LC format connections within a 2RU rack spacing. A similar 1RU chassis 14 can, thus, accommodate 240 standard LC format connections within that 1RU spacing.

Now referring to FIGS. 6A, 7A, and 7B, close-up views of the hinge mechanism 10 are shown. It should be noted that the hinge mechanism 10 includes the same configuration at both the right side and the left side of the chassis 14. For ease of description and illustration, only one side of the hinge mechanism 10 will be discussed in detail with the understanding that the features discussed are fully applicable to the other side.

In the present disclosure, the hinge mechanism 10 will be discussed with reference to the mechanism 10 at the left side of the chassis 14 as shown in FIGS. 6 and 6A, with the understanding that all features discussed for the left side are fully applicable to the right side of the hinge mechanism 10.

As shown in FIGS. 6 and 6A and also in the exploded views of FIGS. 8 and 9, the hinge mechanism 10 includes an outer arm 46 and an inner arm 48. The outer arm 46 is configured to be pivotally connected to the chassis 14 (via a first hinge pin 36a), and the inner arm 48 is configured to be pivotally connected to the door 12 of the chassis 14 (via a second hinge pin 36b). The outer arm 46 and the inner arm 48 are configured to be pivotally connected to each other via a third hinge pin 36c.

In the depicted embodiment, the outer arm 46 is connected to a portion of the cable rings 32 at the front 30 of the chassis 14. The connection is established by a first panel hinge pin 36a that is inserted through a first hinge slot 50a on the outer arm 46. Each hinge pin 36 defines a head portion 52 and a tip portion 54. The head portion 52 defines a first flange 56, and the tip portion 54 defines a pair of flexible arms 58, wherein the pair of flexible arms 58 are configured to flex radially inwardly when passing through a mounting opening 34 or a hinge slot 50 and flex back outwardly thereafter. The flexible arms 58 cooperatively define a second flange 60 for retaining the tip portions 54 within mounting openings 34 or slots 50.

The first hinge pin 36a is used for pivotally mounting the outer hinge arm 46 to one of the cable rings 32 located at the left side of the chassis 14. The first hinge pin 36a is passed through the first hinge slot 50a of the outer arm 46 and a mounting opening 34 of the cable ring 32.

Adjacent the first hinge slot 50a at the bottom of the outer arm 46 is a stop (or sometimes referred to as a "push") tab 62. As shown in FIG. 7A, the stop tab 62 is configured to prevent the outer arm 46 from pivoting any farther when the outer arm 46 has been pivoted to a generally 90-degree angle with respect to the chassis 14. As shown in FIG. 7A, the stop tab 62 rides within a notch 64 provided in the cable ring structure 32 and is configured to abut a stop surface 66 defined at the end of the notch 64 when the outer arm 46 has been fully pivoted-out.

At the opposite side from the stop tab 62, the outer arm 46 defines a second hinge slot 50b. The second hinge slot 50b is configured for receiving the third hinge pin 36c (also referred to as an interface hinge pin). The third hinge pin 36c is for coupling the outer arm 46 to the inner arm 48 as shown in FIGS. 8 and 9. The third hinge pin 36c is passed through the second hinge slot 50b of the outer arm 46 and a first hinge slot 50a defined by the inner arm 48. When the outer and inner arms 46, 48 are coupled, they are positioned between the first and second flanges 56, 60 of the third hinge pin 36c.

Adjacent the second hinge slot 50b, the outer arm 46 defines a track 68 with a push surface 70 at an end thereof. When the outer arm 46 has been coupled to the inner arm 48, the track 68 allows a push tab 62 of the inner arm 48 to slide thereover until it contacts the push surface 70. The push surface 70 is abutted by the push tab 62 of the inner arm 48 for pivoting the outer arm 46 back toward the chassis 14 as will be explained in further detail below.

As shown in FIGS. 8 and 9, as in the hinge pins 36, the inner arm 48 includes the same configuration as the outer arm 46, which can lead to manufacturing efficiencies. When the inner arm 48 is used as part of the hinge mechanism 10 and is coupled to the outer arm 46, however, the inner arm 48 is flipped 180 degrees from the outer arm 46. Thus, when the outer arm 46 is coupled to the inner arm 48, the interface hinge pin 36c passes through the second hinge slot 50b of the outer arm 46 and the first hinge slot 50a of the inner arm 48.

As shown in FIGS. 8 and 9, similar to the outer arm 46, the inner arm 48 also defines a second hinge slot 50b, which is used to couple to the inner arm 48 to the door 12 with a second door hinge pin 36b.

The bodies 72 of the outer and the inner arms 46, 48 define a generally S-shaped configuration. The S-shaped configuration defines notches 74 for accommodating the head portions 52 of the hinge pins 36 when the pins 36 are mounted to the arms 46, 48. For example, when an outer arm 46 is coupled to the inner arm 48, the head portions 52 of the first hinge pin 36a and the second hinge pin 36b oppose each other when the arms 46, 48 are vertically aligned (when the door 12 is fully closed) and are accommodated by the notches 74. Also, as shown in FIG. 7B, when the door 12 is closed and the outer and inner arms 46, 48 are vertically aligned, the head portion 52 of the interface hinge pin 36c may be accommodated by a notch 74 since it is positioned between the outer hinge arm 46 and a portion of the cable ring 32

In operation, referring first to FIG. 6A, when the door 12 of the chassis 14 is pivoted from a closed position to an open position (fully closed position is shown in FIG. 7B), the outer arm 46 starts pivoting out with respect to the chassis 14, and the door 12 starts to pivot with respect to the inner arm 48. The two arms 46, 48 also pivot with respect to each other until the push tab 62 of the inner arm 48 contacts the push surface 70 of the outer arm 46, with the arms 46, 48 ending up in a generally 90-degree relative orientation. When the outer arm 46 is fully pivoted out, the stop tab 62 of the outer arm 46 abuts the stop surface 66 at the end of the notch 64 defined at the cable ring 32. At this point, the outer arm 46 is generally at a 90-degree angle with respect to the chassis 14.

Since the outer arm 46 can extend almost horizontally outwardly from the chassis 14, and the inner arm 48 can pivot to a position where the inner arm 48 is generally about 90 degrees with respect to the outer arm 46, the two arms 46, 48 cooperate to provide spacing for the door 12 to hang down in front of the door 12 therebelow.

When the door 12 is moved from an open position toward the closed position, the door 12 pivots freely with respect to the inner arm 48. And, the inner arm 48 pivots with respect to the outer arm 46 until the push tab 62 of the inner arm 48 abuts the stop surface 70 of the outer arm 46 and starts moving the outer arm 46 toward the chassis 14. When the door 12 is brought to a fully closed position, the outer and inner arms 46, 48 end up in an overlapping vertical configuration (as shown in FIG. 7B) with the head portions 52 of the hinge pins 36 accommodated by the notches 74 defined on the bodies 72 of the outer and inner arms 46, 48.

With the outer and inner arms 46, 48 of the hinge mechanism 10, the hinge mechanism 10 provides a chain-like telescoping movement, wherein the outer arm 46 can pivot with respect to the chassis 14 and with respect to the inner arm 48, and the inner arm 48 can pivot with respect to the outer arm 46 and the door 12. With stop surfaces defined both on the chassis 14 and on the bodies 72 of the arms 46, 48, the range of motion can be controlled for the arms 46, 48 to position the door 12 at the correct open and closed positions.

As shown in FIG. 7B, the inner arm 48 is pivotally connected to a mounting opening 76 defined by the door 12 at an inner surface 78 of the door 12. The mounting opening 76 is also inset from the edges of the door 12 such that when the door 12 is fully closed, the entire hinge mechanism 10 is fully hidden by the door 12 and is invisible from an exterior of the chassis 14.

The hinge mechanism 10 does not interfere with the top of the chassis 14 therebelow and enables the associated door 12 to be fully opened by allowing the door 12 to hang in front of the door 12 therebelow. As shown in FIGS. 1, 2, 6, and 7, the hinge mechanism 10 is configured such that the door 12 can be positioned fully below a horizontal plane 80 defined by a bottom side of the chassis 14 when the door 12 is at a fully open position.

In this manner, any slidable structures such as slidable trays or blades 16 may be extended outwardly or removed from the chassis 14 without interference from the door 12.

As discussed above, the hinge mechanism 10 may be used in a variety of telecommunications chassis 14 as long as the chassis 14 include pin mounting openings 34 and are configured or modified to provide stop surfaces 66 for the outer arms 46 to control the range of motion for the arms 46.

In the chassis stack 20 depicted in FIGS. 1-7, even though the door 12 of the upper chassis 14 is shown as being fully open, it does not hang completely vertically with respect to the lower chassis 14. This is due to handle/latch structures 82 provided on the doors 12. As shown, each door 12 may include a set of upper latches 82a and a set of lower latches 82b. When the door 12 is open, the lower latches 82b of the upper door 12 may abut the upper latches 82a of the lower door 12 to minimize the impact of a freely swinging door 12. In the open position shown in FIGS. 1, 2, 6, and 7, the trays 16 are still able to slide out from the chassis 14 without interference from the door 12.

Other chassis 14 utilizing the hinge mechanism 10 of the present disclosure may or may not include the depicted latches or handles 82 that have impact absorbing features.

Although in the foregoing description, terms such as "top," "bottom," "front," "back," "right," "left," "upper," and "lower" were used for ease of description and illustration, no restriction is intended by such use of the terms. The telecommunications devices described herein can be used in any orientation, depending upon the desired application.

Having described the preferred aspects and embodiments of the present disclosure, modifications and equivalents of the disclosed concepts may readily occur to one skilled in the art. However, it is intended that such modifications and equivalents be included within the scope of the claims which are appended hereto.

PARTS LIST

10 hinge mechanism
12 door
14 chassis/panel
16 tray/blade
18 fiber optic cassette
20 chassis stack
22 right wall
24 left wall
26 rear wall
28 top wall
30 open front
32 cable ring
34 mounting opening
36 hinge pin
36a first hinge pin
36b second hinge pin
36c third hinge pin
38 interior side
40 mounting slot
42 cable management device
44 adapter
46 outer arm
48 inner arm
50 hinge slot
50a first hinge slot
50b second hinge slot
52 head portion
54 tip portion
56 first flange
58 flexible arms
60 second flange
62 stop/push tab
64 notch
66 stop surface
68 track
70 push surface
72 body
74 notch
76 mounting opening of door
78 inner surface of door
80 horizontal plane
82 handle/latch structure
82a upper latch/handle structure
82b lower latch/handle structure

The invention claimed is:

1. A telecommunications system comprising:
a telecommunications chassis;
a door pivotally attached to the chassis via a hinge mechanism, the hinge mechanism further comprising:
an outer hinge arm that is directly and pivotally attached with respect to the chassis;
an inner hinge arm that is positioned inwardly of the outer hinge arm and closer to a center portion of the chassis than the outer hinge arm, wherein the inner hinge arm is pivotally attached with respect to the outer hinge arm and also pivotally attached with respect to the door, wherein the inner hinge arm is attached to the outer hinge arm and the door such that the inner hinge arm is also movable with respect to the chassis, wherein when the door is fully closed, the outer and inner hinge arms are generally vertically overlapped, and when the door is fully open, the outer and inner hinge arms are generally at a perpendicular angle with respect to each other.

2. A telecommunications system according to claim 1, wherein the inner and outer hinge arms include stop tabs that are configured to abut stop surfaces to limit the range of motion for the arms.

3. A telecommunications system according to claim 1, wherein the outer and inner hinge arms are pivotally attached with hinge pins.

4. A telecommunications system according to claim 3, wherein the hinge pins include flexible portions for attachment with snap-fit interlocks.

5. A telecommunications system according to claim 1, wherein the hinge mechanism includes a first set of inner and outer hinge arms at a first side of the chassis and a second set of inner and outer hinge arms at a second side of the chassis.

6. A telecommunications system according to claim 1, wherein the outer hinge arm has a similar configuration to the inner hinge arm.

7. A telecommunications system according to claim 1, wherein the outer and inner hinge arms of the hinge mechanism are configured to be hidden from view by the door when the door is fully closed.

8. A hinge mechanism for pivotally coupling a door to a telecommunications chassis, the hinge mechanism comprising:
   an outer hinge arm configured to be directly and pivotally attached with respect to the chassis;
   an inner hinge arm configured to be positioned inwardly of the outer hinge arm and closer to a center portion of the chassis than the outer hinge arm when attached to the outer hinge arm, wherein the inner hinge arm is configured to be pivotally attached with respect to the outer hinge arm and also configured to be pivotally attached with respect to the door of the chassis, wherein the inner hinge arm is configured to be attached to the outer hinge arm and the door such that the inner hinge arm is also configured to be movable with respect to the chassis;
   wherein the hinge mechanism is configured such that when the door is fully closed, the outer and inner hinge arms are generally vertically overlapped and when the door is fully open, the outer and inner hinge arms are generally at a perpendicular angle with respect to each other.

9. A hinge mechanism according to claim 8, wherein the inner and outer hinge arms include stop tabs that are configured to abut stop surfaces to limit the range of motion for the arms.

10. A hinge mechanism according to claim 8, wherein the outer and inner hinge arms are pivotally attached with hinge pins.

11. A hinge mechanism according to claim 10, wherein the hinge pins include flexible portions for attachment with snap-fit interlocks.

12. A hinge mechanism according to claim 8, further comprising a first set of inner and outer hinge arms configured for mounting at a first side of the chassis and a second set of inner and outer hinge arms configured for mounting at a second side of the chassis.

13. A hinge mechanism according to claim 8, wherein the outer hinge arm has a similar configuration to the inner hinge arm.

* * * * *